United States Patent

Fulford, Jr. et al.

[11] Patent Number: 6,083,846
[45] Date of Patent: Jul. 4, 2000

[54] GRADED MOS TRANSISTOR JUNCTION FORMED BY ALIGNING A SEQUENCE OF IMPLANTS TO A SELECTIVELY REMOVABLE POLYSILICON SIDEWALL SPACE AND OXIDE THERMALLY GROWN THEREON

[75] Inventors: H. Jim Fulford, Jr., Austin; Mark I. Gardner, Cedar Creek; Fred N. Hause, Austin, all of Tex.

[73] Assignee: Advanced Micro Devices, Inc., Sunnyvale, Calif.

[21] Appl. No.: 09/065,508

[22] Filed: Apr. 24, 1998

Related U.S. Application Data

[62] Division of application No. 08/781,443, Jan. 10, 1997, Pat. No. 5,793,089.

[51] Int. Cl.$^7$ .................................................. H01L 21/00
[52] U.S. Cl. ......................... 438/740; 438/719; 438/738; 438/753
[58] Field of Search .................................... 438/305, 306, 438/595, 696, 719, 738, 740, 753

[56] References Cited

U.S. PATENT DOCUMENTS

| | | |
|---|---|---|
| 4,172,260 | 10/1979 | Okabe et al. . |
| 4,463,491 | 8/1984 | Goldman et al. . |
| 4,652,897 | 3/1987 | Okuyama et al. . |
| 4,672,419 | 6/1987 | McDavid ................................ 257/408 |
| 4,737,828 | 4/1988 | Brown . |
| 4,788,663 | 11/1988 | Tanaka et al. . |
| 4,818,714 | 4/1989 | Haskell . |
| 4,818,715 | 4/1989 | Chao . |
| 4,843,023 | 6/1989 | Chiu et al. . |
| 4,868,617 | 9/1989 | Chiao et al. ............................ 257/344 |
| 4,949,136 | 8/1990 | Jain ........................................ 257/344 |
| 4,951,100 | 8/1990 | Parrillo . |
| 4,952,825 | 8/1990 | Toshida . |
| 4,969,639 | 11/1990 | Bergonzoni . |
| 4,994,404 | 2/1991 | Sheng et al. ............................ 257/344 |
| 5,015,598 | 5/1991 | Verhaar . |
| 5,091,763 | 2/1992 | Sanchez ................................. 257/344 |

(List continued on next page.)

FOREIGN PATENT DOCUMENTS

| | | |
|---|---|---|
| 58-137255 | 8/1983 | Japan . |
| 62-200757 | 9/1987 | Japan . |
| 63-161660 | 7/1988 | Japan . |
| 2-280342 | 11/1990 | Japan . |
| 3-41773 | 2/1991 | Japan . |
| 4-85968 | 3/1992 | Japan . |
| 4-171730 | 6/1992 | Japan . |
| 4-208571 | 7/1992 | Japan . |
| 5-75115 | 3/1993 | Japan . |
| 5-129325 | 5/1993 | Japan . |
| 5-267327 | 10/1993 | Japan . |

OTHER PUBLICATIONS

Wolf et al., *Silicon Processing for the VLSI Era, Vol. 1: Process Technology*, Lattice Press 1986, p. 183.

*Primary Examiner*—William Powell
*Attorney, Agent, or Firm*—Kevin L. Daffer; Conley, Rose & Tayon

[57] ABSTRACT

A transistor and transistor fabrication method are presented where a sequence of layers are formed and either entirely or partially removed upon sidewall surfaces of a gate conductor. The formation and removal of layers produces a lateral surface to which various implants can be aligned. Those implants, placed in succession produce a highly graded junction having a relatively smooth doping profile. Preferably, the multi-layer spacer structure comprises a polysilicon spacer interposed between a grown oxide and an etch stop. The oxide is grown upon the polysilicon to align a source/drain implant. Either before the source/drain implant or after the source/drain implant, the oxide and polysilicon partially consumed by the oxide is removed to provide a lateral surface to which an MDD implant aligns. A combination of etch stop, polysilicon spacer and grown possibly sacrificial oxide allows a greater ease by which multiple implants can be forwarded into junctions of either an NMOS or PMOS transistor.

11 Claims, 3 Drawing Sheets

U.S. PATENT DOCUMENTS

| | | |
|---|---|---|
| 5,153,145 | 10/1992 | Lee et al. . |
| 5,168,072 | 12/1992 | Moslehi . |
| 5,216,268 | 6/1993 | Chen et al. . |
| 5,234,850 | 8/1993 | Liao . |
| 5,241,203 | 8/1993 | Hsu et al. . |
| 5,258,319 | 11/1993 | Inuishi et al. . |
| 5,274,261 | 12/1993 | Chen ........................................ 257/344 |
| 5,298,446 | 3/1994 | Onishi et al. . |
| 5,324,974 | 6/1994 | Liao . |
| 5,332,914 | 7/1994 | Hazani . |
| 5,334,870 | 8/1994 | Katada et al. . |
| 5,371,394 | 12/1994 | Ma et al. . |
| 5,386,133 | 1/1995 | Hiroki et al. ............................ 257/344 |
| 5,405,791 | 4/1995 | Ahmad et al. . |
| 5,422,506 | 6/1995 | Zamapian . |
| 5,444,282 | 8/1995 | Yamaguchi et al. . |
| 5,473,184 | 12/1995 | Murai ....................................... 257/336 |
| 5,477,070 | 12/1995 | Nam . |
| 5,494,838 | 2/1996 | Chang et al. . |
| 5,498,555 | 3/1996 | Lin . |
| 5,608,240 | 3/1997 | Kumagai . |
| 5,663,586 | 9/1997 | Lin ........................................... 257/900 |
| 5,665,620 | 9/1997 | Nguyen et al. . |
| 5,679,589 | 10/1997 | Lee et al. . |
| 5,714,413 | 2/1998 | Brigham et al. . |
| 5,719,425 | 2/1998 | Akram et al. . |
| 5,766,969 | 6/1998 | Fulford, Jr. et al. . |
| 5,783,475 | 7/1998 | Ramaswami . |
| 5,793,089 | 8/1998 | Fulford, Jr. et al. . |
| 5,827,769 | 10/1998 | Aminzedeh et al. . |
| 5,830,794 | 11/1998 | Kusunoki et al. . |
| 5,837,572 | 11/1998 | Gardner et al. . |
| 5,847,428 | 12/1998 | Fulford, Jr. et al. . |
| 5,869,866 | 2/1999 | Fulford, Jr. et al. . |
| 5,869,879 | 2/1999 | Fulford, Jr. et al. . |

# GRADED MOS TRANSISTOR JUNCTION FORMED BY ALIGNING A SEQUENCE OF IMPLANTS TO A SELECTIVELY REMOVABLE POLYSILICON SIDEWALL SPACE AND OXIDE THERMALLY GROWN THEREON

This is a Division of application Ser. No. 08/781,443, filed Jan. 10, 1997, now U.S. Pat. No. 5,793,089.

BACKGROUND OF THE INVENTION

1. Field of the Invention

This invention relates to semiconductor processing and, more particularly, to a method of forming and removing multiple layers upon and from, respectively, sidewall surfaces of a gate conductor for producing a graded junction of an MOS transistor which is less susceptible to hot-carrier effects.

2. Description of Related Art

Fabrication of a metal-oxide semiconductor ("MOS") transistor is well known. The manufacture of an MOS transistor begins by defining active areas where the transistor will be formed. The active areas are isolated from other areas on the semiconductor substrate by various isolation structures formed upon and within the substrate. Isolation structures come in many forms. For example, the isolation structures can be formed by etching trenches into the substrate and then filling the trenches with a dielectric fill material. Isolation structures may also be formed by locally oxidizing the silicon substrate using the well recognized LOCOS technique.

Once the isolation structures are defined between transistor active areas, a gate dielectric is formed. Typically, the gate dielectric is formed by thermal oxidation of the silicon substrate. Thermal oxidation is achieved by subjecting the substrate to an oxygen-bearing, heated ambient in, for example, an oxidation furnace or a rapid thermal annealer ("RTA"). A gate conductor material is then deposited across the entire dielectric-covered substrate. The gate conductor material is preferably polycrystalline silicon, or polysilicon. The polysilicon layer is then patterned using a photolithography mask. The mask allows select removal of a light-sensitive material deposited entirely across polysilicon. The material which is exposed can, according to one embodiment, be polymerized, and that which is not exposed removed. Selective polymerization is often referred to as the "develop" stage of lithography. The regions which are non-polymerized are removed using the etch stage of lithography.

The patterned gate conductor material, if polysilicon, is rendered conductive with the introduction of ions from an implanter or a diffusion furnace. Depending on the implant species forwarded into the gate conductor, either an n-channel transistor (NMOS transistor) or a p-channel transistor (PMOS transistor) is formed. NMOS transistors employ n-type dopants on opposite sides of the NMOS gate conductor, whereas PMOS transistors employ p-type dopants on opposite sides of the PMOS transistor gate conductor. The regions of the substrate which receive dopants on opposite sides of the gate conductor are generally referred to as junction regions, and a distance between junction regions is typically referred to as the physical channel length. After implantation and subsequent diffusion of the junction regions, the distance between the junction regions becomes less than the physical channel length and is often referred to as the effective channel length ("Leff"). In high density designs, not only does the physical channel length become small so to must the Leff. As Leff decreases below approximately 1.0 μm, for example, a problem known as short channel effects ("SCE") becomes predominant.

A problem related to SCE, and the subthreshold currents associated therewith, but altogether different is the problem of hot-carrier effects ("HCE"). HCE is a phenomenon by which hot-carriers ("holes and electrons") arrive at or near an electric field gradient. The electric field gradient, often referred to as the maximum electric field ("Em") occurs near the drain during saturated operation. More specifically, the electric field is predominant at the lateral junction of the drain adjacent to the channel. The electric field at the drain causes primarily electrons in the channel to gain kinetic energy and become "hot". These hot electrons traveling to the drain lose their energy by a process called impact ionization. Impact ionization serves to generate electron-hole pairs, wherein the pairs migrate to and become injected within the gate dielectric near the drain junction. Traps within the gate dielectric generally become electron traps, even if they are partially filled with holes. As a result, there is a net negative charge density in the gate dielectric. The trapped charge accumulates with time, resulting in a positive threshold shift in the NMOS transistor, or a negative threshold shift in a PMOS transistor. It is known that since hot electrons are more mobile than hot holes, HCE causes a greater threshold skew in NMOS transistors than PMOS transistors. Nonetheless, a PMOS transistor will undergo negative threshold skew if its Leff is less than, e.g., 0.8 μm.

Unless modifications are made to the process in which relatively small transistors are formed, problems with subthreshold current and threshold shift resulting from SCE and HCE will remain. To overcome these problems, alternative drain structures such as double-diffused drain ("DDD") and lightly doped drain ("LDD") structures must be used. The purpose of both types of structures is the same: to absorb some of the potential into the drain and thus reduce Em. The popularity of DDD structures has given way to LDD structures since DDD causes unacceptably deep junctions and deleterious junction capacitance.

A conventional LDD structure is one whereby a light concentration of dopant is self-aligned to the edge of the gate conductor. The light-dopant concentration is then followed by a heavier-dopant concentration which is self-aligned to a spacer formed on the sidewalls of the gate conductor. The purpose of the first implant dose is to produce a lightly doped section of both the source and drain junction areas at the gate edge near the channel. The second implant dose is spaced from the channel a distance dictated by the thickness of the sidewall spacer. Resulting from the first and second implants, a dopant gradient occurs across the junction from the source/drain area of the junction to the LDD area adjacent the channel.

A properly defined LDD structure is one which introduces a light concentration of dopants so as to minimize the abruptness in voltage changes near the drain side of the channel. Dispersing abrupt voltage changes reduces Em strength and the harmful hot carrier effects resulting therefrom. A need therefore exists for producing a gradual doping profile for the purpose of dispersing Em within the drain junction. However, the gradual doping profile must be achieved without introducing an excessive amount of spacer layers on the gate conductor sidewall surface. Further, the number of implant steps needed to achieve an optimal gradual doping profile must also be as few as possible. Each added spacer layer and implant step involves significant complexity and therefore reduces the processing throughput.
}

SUMMARY OF THE INVENTION

The problems outlined above are in large part solved by an integrated circuit and integrated circuit fabrication method hereof. The present structure and method employs a layer within a multi-layer spacer structure that can serve as a mask a plurality of separate implant steps. The herein defined spacer comprises polysilicon which, after deposition and subsequent partial removal, serves as a mask for two separate implants. The deposited polysilicon provides masking for a first implant. However, after growth of an overlying layer, the polysilicon layer is partially consumed. The consumed polysilicon material can then be removed with the overlying grown material so the resulting, partially retained polysilicon serves as a mask for another implant. Accordingly, the polysilicon serves to mask two implants; a first implant after polysilicon is deposited and a second implant after a portion of the polysilicon is removed.

The polysilicon layer within the multi-layer spacer structure beneficially minimizes the number of deposition steps needed to form the spacer structure. For example, instead of requiring three deposition steps to form three distinct lateral masking surfaces, the present process requires only one deposition step followed by a growth/removal cycle. A combination of polysilicon and grown oxide serves as a source/drain implant mask, and the polysilicon layer serves as a medium doped drain ("MDD") implant mask. However, a further benefit is achieved when the grown oxide is removed from the polysilicon. As the oxide is removed, polysilicon consumed during oxide growth will also be removed. This removal step is highly selective to oxide as opposed to underlying polysilicon. The result being a newly defined lateral surface which can then be used to mask another MDD implant laterally offset from the previous MDD implant. Accordingly, use of polysilicon and an overlying grown oxide which is sacrificial serves to produce three separate and distinct lateral masking surfaces. Those surfaces are produced by a single deposition step involving polysilicon, followed by thermal exposure in oxygen, followed by oxide etch. As such only one time-consumptive chemical vapor deposition ("CVD") cycle is needed to bring about potentially three junction implants having one lateral surface displaced from each of the other two.

The multi-layer sidewall structure benefits from a polysilicon layer interposed between an etch stop layer and an oxide layer. The etch stop layer exists immediately adjacent sidewall surfaces of a gate conductor as well as regions upon the semiconductor substrate proximate to the gate conductor. The polysilicon layer etches at a dissimilar rate from that of the overlying oxide or the underlying etch stop. According to one embodiment, the multi-layer spacer structure is first formed, and then each layer is removed selectively from the underlying layer. Prior to removing the first layer, a source/drain implant occurs within the junction regions using the entire multi-layer spacer as a mask. Thereafter, each layer is successively removed followed by a corresponding implant of lesser energy and lesser concentration than the source/drain implant. The polysilicon layer is removed in two steps: the first occurring through oxide consumption and the last occurring through an entire polysilicon strip. An MDD implant occurs after partial removal of the polysilicon and also after complete removal of the polysilicon. Finally, an LDD implant can be forwarded after the etch stop is removed.

According to an alternative embodiment, implant occur at increasing concentrations and energies during the additive formation of the multi-layer sidewall structure. Specifically, an LDD implant occurs prior to forming the etch stop. After the etch stop is deposited another implant can occur, similar to implants which occur after forming polysilicon on sidewall surfaces of the etch stop and oxide on sidewall surfaces of the polysilicon. In this embodiment, the first implant is the LDD implant, the intermediate implants are MDD implants, and the final implant is a source/drain implant.

In either embodiment, the combination of LDD, MDD and source/drain implants produce a highly graded doping profile within either an NMOS or a PMOS transistor junction. According to one embodiment, at least three and possibly up to five implant areas can be defined within each junction of either an NMOS or PMOS transistor. The implant areas define gradually increasing concentration and implant depths as the spacing from the channel increases. The multiple implants which produce the ensuing "graded" junctions are advantageously produced from only an etch stop deposition, a polysilicon deposition and a thermal oxidation/removal sequence. Of benefit is the growth of an oxide layer on the polysilicon rather than having to attempt deposition thereon. If deposition were chosen rather than oxide growth, deposition would require a blanket depositing step followed possibly by an anisotropic etch. Instead, the present process merely requires subjecting the polysilicon to an oxidizing ambient, wherein the oxide layer will naturally align with the sidewall surface of the polysilicon spacer. Of further benefit is the additional masking afforded by thereafter removing the oxide and the partially consumed polysilicon. This masking allows for another MDD implant—a benefit to which conventional multi-layer spacer structures cannot achieve.

Broadly speaking, the present invention contemplates an integrated circuit. The integrated circuit comprises a transistor having a gate conductor dielectrically spaced over a channel area. The channel area is interposed between a pair of junction areas. An etch stop layer is formed upon opposed sidewall surfaces of the gate conductor and upon the pair of junction areas. A polysilicon spacer is formed upon the etch stop layer proximate to the opposed sidewall surfaces. The polysilicon spacer affords thermal growth of oxide upon and partially into the exposed surfaces of the polysilicon spacer. A plurality of differing concentration implants may then be forwarded in succession into the pair of junction areas in lateral alignment with the gate conductor sidewall surfaces, polysilicon spacer, oxide and polysilicon removed of oxide.

The present invention further contemplates a method for forming a transistor. The method comprises the steps of providing a semiconductor substrate over which a gate conductor having opposed sidewall surfaces is dielectrically spaced. An etch stop layer is then deposited upon the sidewall surfaces, followed by depositing a polysilicon layer upon the etch stop layer, and followed by growing an oxide upon the polysilicon spacer. The combination of etch stop, overlying polysilicon spacer, and overlying oxide comprise a multi-layer spacer structure. According to one embodiment, an implant occurs after each layer of the multi-layer spacer structure is formed, beginning with an LDD implant, followed by one or more MDD implants, and ending a with a source/drain implant. According to an alternative embodiment, the fast implant or source/drain implant, occur after the entire multi-layer spacer is formed. Thereafter, layers of the multi-layer spacer are selectively removed and a corresponding implant occurs. Following removal of the first (outermost) layer, an MDD implant occurs. Following the removal of the last layer of the multi-layer spacer, an LDD implant occurs.

BRIEF DESCRIPTION OF THE DRAWINGS

Other objects and advantages of the invention will become apparent upon reading the following detailed description and upon reference to the accompanying drawings in which.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE PREFERRED EMBODIMENTS

Figure 1:
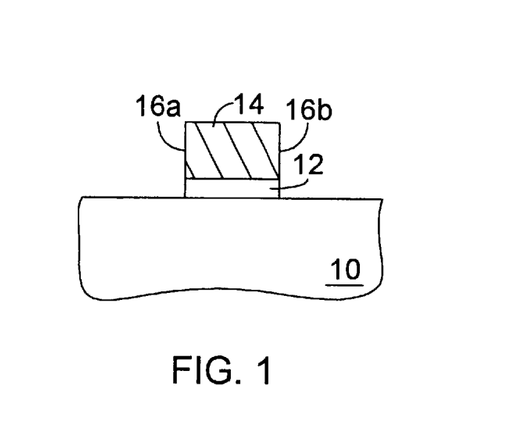
FIG. 1 is a partial cross-sectional view of a semiconductor topography having a gate conductor formed a dielectric distance above a semiconductor substrate.

Turning now to the drawings, FIG. 1 illustrates a partial cross-sectional view of a semiconductor substrate 10, preferably made of single crystalline silicon. Deposited entirely across substrate 10 is a dielectric 12 where the dielectric is either deposited or grown from a heated, oxygen bearing source. Deposited upon oxide 12 is a gate conductor material 14, preferably made of polycrystalline silicon which is rendered conductive by a subsequent implanting step. Gate conductor 14 and underlying gate dielectric 12 are patterned using well-known lithography techniques. The patterned structure resides in active regions which encompasses exposed regions of substrate 10 residing on opposite sides of a channel beneath gate conductor 14. The exposed regions are herein referred to as junction regions.

Gate dielectric 12 is preferably formed in a thermal oxidation furnace using temperatures of approximately 700° to 900° C. for a relatively short (e.g., less than 60 minutes) time. It is preferred that gate dielectric 12 be grown to a thickness of approximately 15–200 angstroms. Gate conductor 14 is deposited upon gate dielectric 12 and patterned between opposing sidewall surfaces 16a and 16b. The polysilicon layer is preferably deposited using a low pressure chemical vapor deposition ("CVD") process, and then patterned using an expose, develop an etch sequence.

Figure 2:
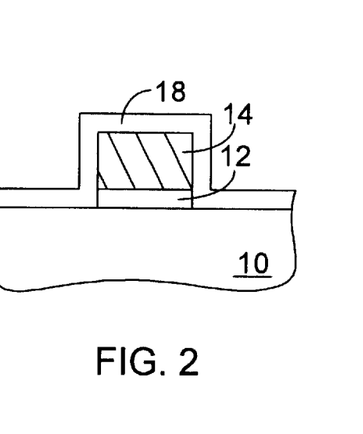
FIG. 2 is a partial cross-sectional view of the semiconductor topography according to a processing step subsequent to FIG. 1, wherein an etch stop layer is formed on the gate conductor and semiconductor substrate.

Referring to FIG. 2, a processing step subsequent to FIG. 1 is shown. Specifically, FIG. 2 illustrates an etch stop layer 18 formed on the exposed topography comprising substrate 10, gate conductor 14 and sidewall surfaces of gate dielectric 12. According to one embodiment, etch stop 18 comprises thermally grown oxide which forms upon and slightly into polysilicon gate conductor 14 as well as silicon substrate 10. Thereafter, the grown oxide is capped with a deposited silicon nitride. Accordingly, etch stop 18 may comprise a single dielectric layer or multiple dielectric layers preferably comprising a grown oxide followed by a deposited nitride. The oxide grown upon and into polysilicon gate conductor 14 as well as substrate 10 may be formed in a thermal oxidation furnace using temperatures of approximately 700°–900° C. In alternative embodiments, etch stop 18 may comprise a CVD nitride overlying a CVD oxide, both of which have dissimilar etch characteristics compared to gate conductor 14.

Figure 3:
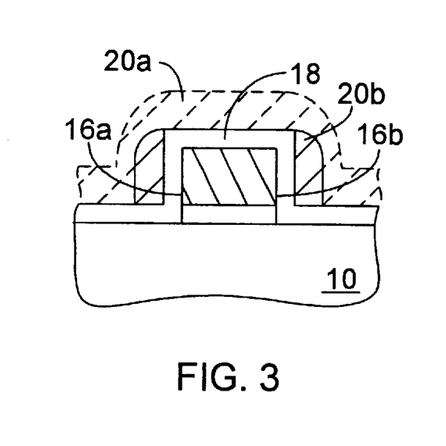
FIG. 3 is a partial cross-sectional view of the semiconductor topography according to a processing step subsequent to FIG. 2, wherein a polysilicon spacer is formed on the substantially vertical surfaces of the etch stop proximate to the gate conductor.

FIG. 3 illustrates deposition of a partially sacrificial material 20a. Material 20a preferably comprises polysilicon deposited from a CVD apparatus. Material 20a is deposited across the entire semiconductor topography to form a conformal layer. Material 20a comprises any material which can accommodate subsequent oxide growth and which has dissimilar etch characteristics compared to etch stop 18. After deposition, material 20a undergoes an anisotropic etch. Anisotropic etch is designed as a plasma etch employing both physical and chemical removal mechanisms. Ions are bombarded at an angle substantially perpendicular to substrate 10 upper surface. This causes substantially horizontal surfaces to be removed faster than substantially vertical surfaces. Accordingly, anisotropic etching removes a portion of material 20a, that portion existing over horizontal surfaces of etch stop 18 and over horizontal surfaces of substrate 10 removed a spaced distance from gate conductor 14. The only regions of material 20a which remain are those regions near substantially vertical surfaces (i.e., regions adjacent sidewall surfaces 16a and 16b of gate conductor 14). The remaining regions of material 20a are henceforth referred to as polysilicon spacers 20b.

Figure 4:
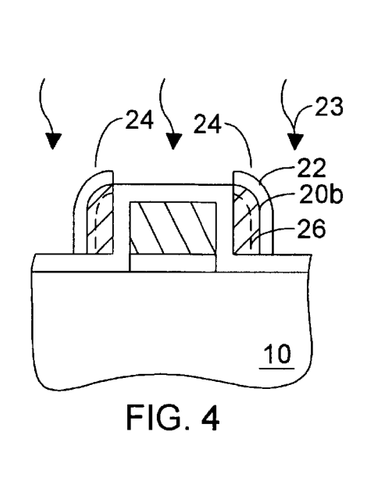
FIG. 4 is a partial cross-sectional view of the semiconductor topography according to a processing step subsequent to FIG. 3, wherein an oxide is grown on exposed surfaces of the polysilicon spacer to form a multi-layer spacer structure.

A final layer 22 of a multi-layer spacer structure 24 is formed on polysilicon spacer 20b, as shown in FIG. 4. Layer 22 is preferably a layer which is grown by exposing polysilicon spacer 20b to elevated temperatures 23 in the presence of an oxygen bearing ambient. Accordingly, layer 22 is preferably an oxide layer which, as it grows, extends outward from polysilicon spacer 20b and inward into polysilicon spacer 20b according to dashed lines 26. Depending upon the relative densities and molecular weights of silicon and silicon dioxide, it is found that the amount of silicon within substrate 10 and polysilicon 20b being consumed is between 40% to approximately 50% of the final oxide thickness. The amount of polysilicon being consumed (or converted to oxide) is important with respect to forming a subsequent spacer lateral boundary, the benefit of which is set forth below.

Figure 5:
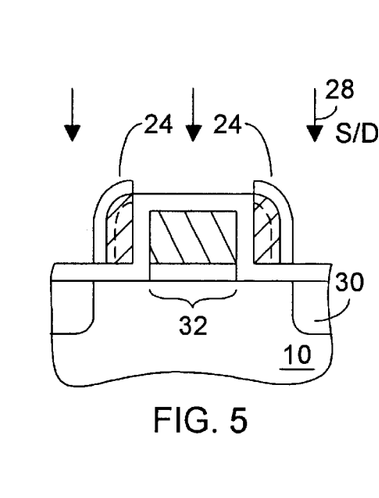
FIG. 5 is a partial cross-sectional view of the semiconductor topography according to a processing step subsequent to FIG. 4, wherein the multi-layer spacer serves to mask a portion of each junction from source/drain implant.

FIG. 5 illustrates multi-layer spacer 24 used as a mask for source/drain implant 28. Source/drain implant comprises any n-type or p-type dopant species forwarded at approximately perpendicular angles (preferably 7° from perpendicular) to the upper surface of substrate 10. Dopant species of implant 28, relatively speaking, are placed at fairly high concentrations and implant energies to form source/drain regions 30 within corresponding junctions a spaced distance from a channel 32.

Figure 6:
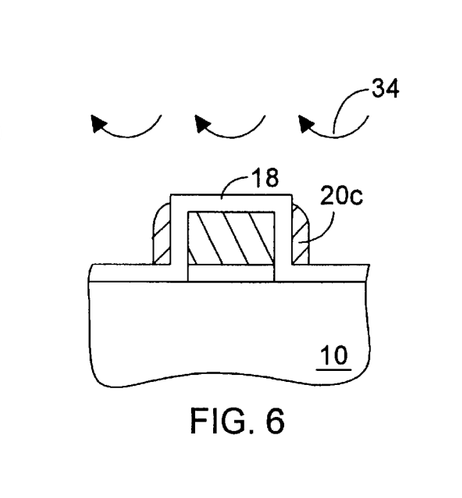
FIG. 6 is a partial cross-sectional view of the semiconductor topography according to a processing step subsequent to FIG. 5, wherein the oxide and a portion of the consumed polysilicon are removed.

FIG. 6 illustrates removal of oxide 22 from multi-layer spacer 24. Preferably, removal is achieved by a wet etch process 34 using, for example, various well known oxide removal solutions. The solution chosen is one which removes silicon dioxide with high selectively against removal of underlying, nitride etch stop 18 and underlying, retained portion of polysilicon spacer 20b. The retained portion 20c of polysilicon spacer 20b is that portion not consumed during oxide growth.

Figure 7:
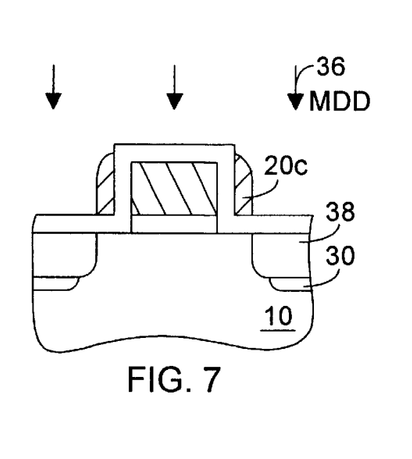
FIG. 7 is a partial cross-sectional view of the semiconductor topography according to a processing step subsequent to FIG. 6, wherein the remaining polysilicon serves to mask a portion of each junction from an MDD implant.
Figure 8:
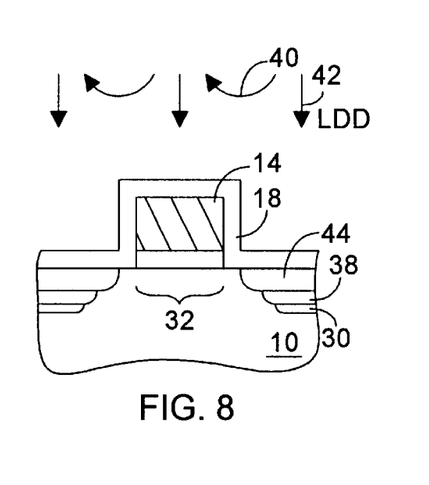
FIG. 8 is a partial cross-sectional view of the semiconductor topography according to a processing step subsequent to FIG. 7, wherein the remaining polysilicon (possibly in combination with the etch stop) is removed to provide a mask for an LDD implant.

FIG. 7 depicts remaining polysilicon spacer 20c used as a mask against MDD implant 36. MDD implant 36 is of the same dopant species as source/drain implant 28 but utilizes lower concentrations and energies to form MDD area 38. FIG. 8 illustrates two steps subsequent to FIG. 7. First, remaining polysilicon spacer 20c is removed using a wet etch solution selective to polysilicon as opposed to the underlying etch stop 18, a suitable etch stop being silicon nitride. The etch step is shown as reference numeral 40. Secondly, once polysilicon spacer 20c is removed, an another MDD implant can occur or, alternatively, an LDD implant 42 occurs. LDD implant 42 is of the same dopant species as source/drain implant 28 and MDD implant 36, albeit at a lower concentrations and energies than the source/drain and MDD implants. Resulting from LDD implant 42, an LDD area 44 is produced. According to an alternative embodiment, both polysilicon 20c and etch stop 18 are removed in two successive etch steps, leaving sidewall surfaces 16a and 16b intact. Those sidewall surfaces, and more specifically, the remaining gate conductor 14 serves to align LDD implant 42 adjacent to channel 32. As such, removal of both polysilicon spacer 20c and etch stop 18 allows LDD area 44 to be placed closer to channel 32, than that shown in FIG. 8.

Figure 9:
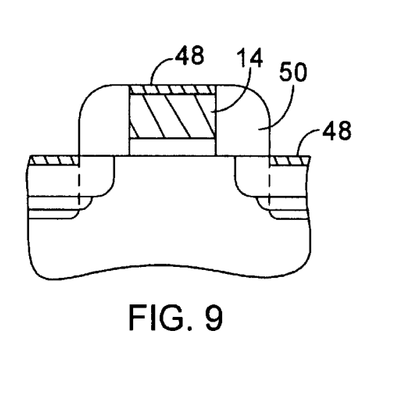
FIG. 9 is a partial cross-sectional view of the semiconductor topography according to a processing step subsequent to FIG. 8, wherein a salicide is formed on exposed gate conductor and junction upper surfaces.

FIG. 9 depicts salicidation of exposed silicon based surfaces. Specifically, FIG. 9 depicts a salicide process in which a salicide/polyside 48 is formed in the junctions and polysilicon surfaces of the ensuing NMOS or PMOS transistor. The salicide results from depositing a refractory metal on the exposed semiconductor topography. The metal undergoes a two-step anneal process. The first anneal cycle causes a first phase reaction. All non-reacted metal is removed except in regions where the silicon atoms are prevalent. As such, regions between silicon-rich areas, i.e., serve to prevent silicide growth. Those regions are denoted as oxide 50 formed on sidewall surfaces of gate conductor 14. Oxide 50 is formed after LDD implant is concluded. Thus, the second anneal step causes a second phase reaction of refractory metal only in silicon based junctions and possibly on the upper surfaces of the polysilicon gate conductor 14. The silicide serves to enhance conductivity of subsequent metalization layers drawn to the junctions. For sake of brevity and clarity of the drawings, the silicide formation steps and subsequent metalization layers are not shown. However, it is to be understood an integrated circuit which utilizes the present process will have subsequent fabrication steps involving interlevel dielectrics and one or more layers of metalization.

FIGS. 1–9 illustrate a processing sequence in which multi-level spacer structure 24 is formed. Thereafter, outermost layers of that structure are removed in sequence, followed by a respective implant step. At least three implants can occur by removing three separate layers from multi-layer spacer 24. Those implants are defined as a heavier concentration source/drain implant, followed by medium concentration MDD implants and lastly followed by a lighter concentration LDD implant. FIGS. 10–18 depict an alternate processing sequence to that of FIGS. 1–9. Specifically, FIGS. 10–18 illustrate implant of LDD, followed by MDD implant, and finally followed by source/drain implant during the layer-by-layer additive formation of a multi-layer spacer structure. Thus, instead of implanting after subtractive removal of layers, FIGS. 10–18 illustrate implant during layer-by-layer addition.

Figure 10:
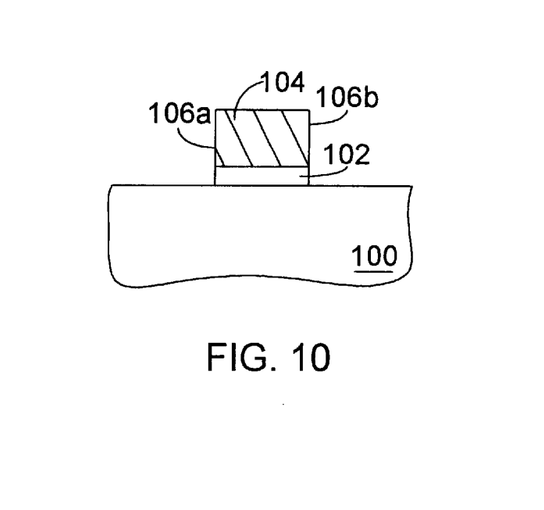
FIG. 10 illustrates an initial processing step of an alternate processing sequence to that of FIGS. 1–9.

Referring to FIG. 10, a partial cross-sectional view of semiconductor substrate 100 is shown at a processing step according to an alternative embodiment. Formed upon substrate 100 is a patterned gate dielectric 102 and a gate conductor 104, similar to the sequence used in FIG. 1. Gate conductor 104 is defined between sidewall surfaces 106a and 106b.

Figure 11:
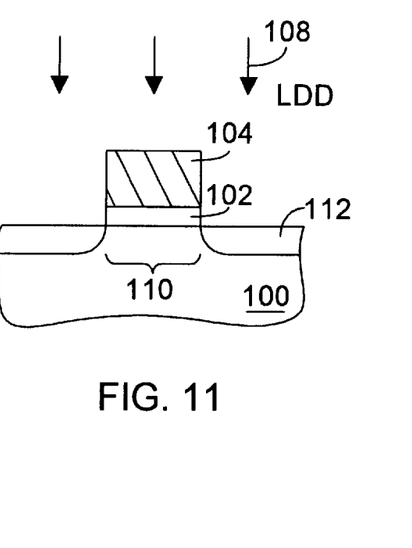
FIG. 11 is a partial cross-sectional view of the semiconductor topography according to a processing step subsequent to FIG. 10, wherein the gate conductor serves to align an LDD implant into each junction within the semiconductor substrate.
Figure 12:
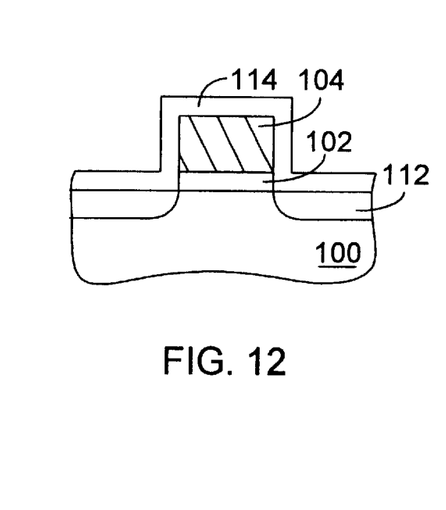
FIG. 12 is a partial cross-sectional view of the semiconductor topography according to a processing step subsequent to FIG. 11, wherein an etch stop layer is formed on the gate conductor and semiconductor substrate.

In a processing step subsequent to FIG. 10, FIG. 11 illustrates an LDD implant 108 into substrate 100. Gate conductor 104 and gate dielectric 102 serve to mask implant 108 from channel region 110 to form LDD areas 112. FIG. 12 illustrates formation of an etch stop layer 114 upon the exposed topography comprising gate conductor 104, gate dielectric 102 and substrate 100. Similar to etch stop 18, etch stop 114 may comprise a singular dielectric layer or multiple dielectric layers, preferably including a nitride layer upper surface layer. Etch stop 114 is formed at a thickness sufficient to provide proper coverage of all exposed surfaces and also to preclude etching through the etch stop when the overlying material is being removed. Conversely, etch stop 114 need not be too thick as to make it time consumptive to remove (if needed).

Figure 13:
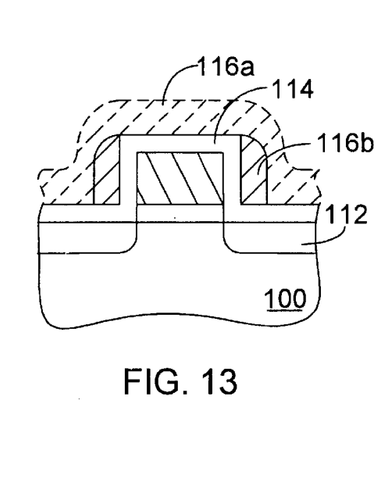
FIG. 13 is a partial cross-sectional view of a the semiconductor topography according to a processing step subsequent to FIG. 12, wherein a polysilicon spacer is formed on the substantially vertical surfaces of the etch stop proximate to the gate conductor.

FIG. 13 illustrates formation of a polysilicon spacer 116b from a deposited polysilicon material 116a. Formation of polysilicon spacer 116b is similar to the step shown in FIG. 3 to produce polysilicon spacer 20b.

Figure 14:
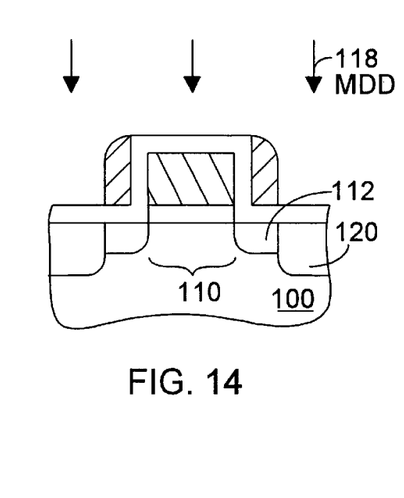
FIG. 14 is a partial cross-sectional view of the semiconductor topography according to a processing subsequent to FIG. 13, wherein a polysilicon spacer and etch stop serve to mask a portion of each junction from an MDD implant.

FIG. 14 depicts an MDD implant 118 forwarded into junctions of substrate 100. MDD implant 118 is masked a spaced distance from channel region 110 to form MDD area 120. Relatively speaking, MDD implant 118 is of higher concentration and implant energy than LDD implant 108.

Figure 15:
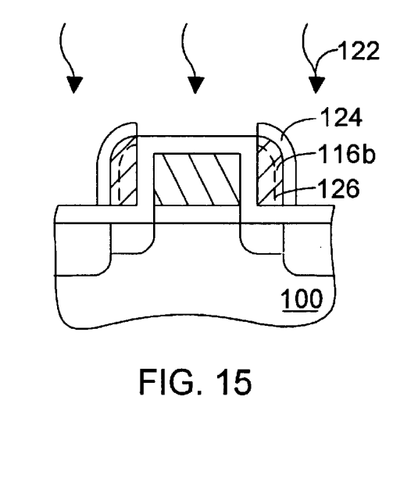
FIG. 15 is a partial cross-sectional view of the semiconductor topography according to a processing step subsequent to FIG. 14, wherein an oxide is grown on exposed surfaces of the polysilicon spacer to form a multi-layer spacer structure.

FIG. 15 illustrates oxidation 122 of polysilicon spacer 116b to form an oxide layer 124. Similar to the steps shown in FIG. 4, oxide 124 consumes the upper and outer exposed surfaces of polysilicon spacer 116b to define an inward or lower boundary 126 of oxide 124.

Figure 16:
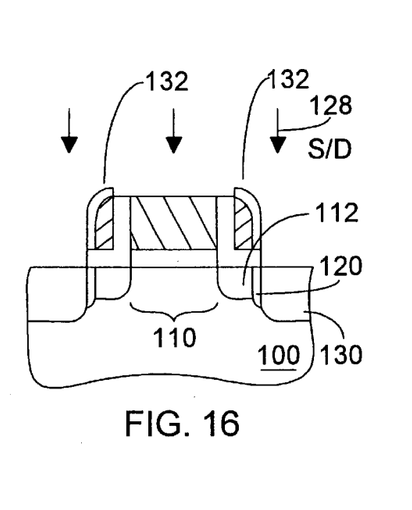
FIG. 16 is a partial cross-sectional view of the semiconductor topography according to a processing step subsequent to FIG. 15, wherein the multi-layer spacer structure serves to mask a portion of each junction from a source/drain implant.

FIG. 16 illustrates a source/drain implant 128. Source/drain implant 128 is of higher concentration and implant energy than either LDD implant 108 or MDD implant 118. Source/drain implant 128 forms a source/drain region 130 a spaced distance from channel 110 in accordance with the masking provided by a multi-layer spacer structure 132. The source/drain implant 128 therefore parallels the step shown in FIG. 5 except that LDD an MDD implant areas 112 and 120, respectively, pre-exist.

Figure 17:
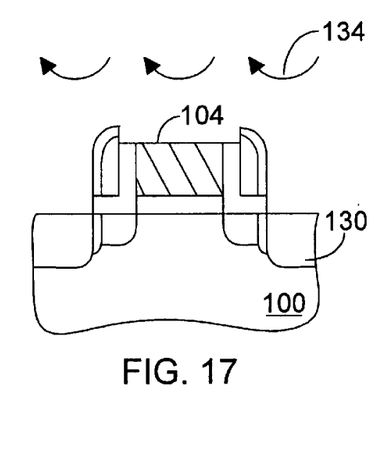
FIG. 17 is a partial cross-sectional view of the semiconductor topography according to a processing step subsequent to FIG. 16, wherein exposed portions of the etch stop may be removed; and, FIG. 18 a partial cross-sectional view of the semiconductor topography according to a processing step subsequent to FIG. 17, wherein a salicide is formed on exposed gate conductor and junction upper surfaces.

FIG. 17 illustrates, according to one embodiment, removal 134 of exposed etch stop layer 114 from source/drain regions 130 of corresponding junctions and from the upper surface of gate conductor 104. Removing the etch stop layer affords salicidation of the exposed silicon-bearing surfaces in accordance with that shown in FIG. 18. The salicidation process produces silicide and polycide regions 136 denoted in FIG. 18. The multi-layer spacer structure 132 serves to prevent silicide formation between the junction and gate conductor regions, and therefore prevents the bridging problems.

Figure 18:
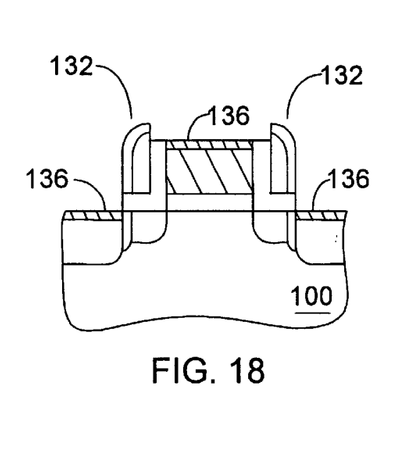

Silicide 136 is formed in accordance with a two step process described in reference to FIG. 9. The benefit of the processing sequence culminating in FIG. 18 is that of pre-existing spacer structure 132. Sparer 132 serves to prevent silicide growth thereon, whereas if the multi-layer spacer is remove in accordance with the processing step culminating in FIG. 9, then a spacer must be reformed to prevent silicide bridging. That spacer is shown in FIG. 9 as reference numeral 50.

Regardless of which processing sequence is chosen, the end result remains the same, which is to produce junctions on opposing sides of a channel having highly graded doping profiles. Those junctions are graded by utilizing the benefits of a polysilicon which is partially consumed and therefore partially removed in processing steps which are easier to instill than conventional spacer deposition steps. Accordingly, the present process takes advantage of self-aligned oxidation rather than separate deposition and anisotropic etch back techniques. Oxidation is more easily and readily formed than deposition and etch back and, more importantly, provides a resource for subsequent partial removal. Removal is also self-aligned to provide another sidewall surface to which a further MDD implant is masked. Therefore, not only is the present multi-layer spacer structure more readily formed, but also beneficially provides more laterally displaced junction implant areas than conventional spacers and junction implants.

It will be appreciated to those skilled in the art having the benefit of this disclosure that the present processing sequences are believed to be capable of forming junctions with a smooth doping profile and, furthermore, for performing the LDD implants either first or last in a sequence. If the LDD implants are performed last, then an anneal of the earlier source/drain and MDD implant can be performed at higher temperatures to avoid excessive migration of the subsequent, temperature sensitive LDD implant areas. Furthermore, it is also to be understood that the form of the invention shown and described is to be taken as exemplary, presently preferred embodiments. Various modifications and changes may be made without departing from the spirit and scope of the invention as set forth in the claims. It is intended that the following claims be interpreted to embrace all such modifications and changes.

What is claimed is:

1. A method for forming a transistor, comprising:
    providing a semiconductor substrate over which a gate conductor having opposed sidewall surfaces is dielectrically spaced; and
    depositing an etch stop layer upon the sidewall surfaces, followed by depositing a polysilicon spacer upon the etch stop layer and followed by growing an oxide upon the polysilicon spacer to form a multi-layer spacer.

2. The method as recited in claim 1, wherein said multi-layer spacer serves as a mask to which a sequence of implants are successively aligned after formation of said sidewall surfaces, followed by formation of said etch stop, followed by formation of said polysilicon spacer and followed by formation of said oxide.

3. The method as recited in claim 1, wherein said multi-layer spacer serves as a mask to which a sequence of implants are successively aligned after removal of said oxide, after removal of said polysilicon spacer and after removal of said etch stop.

4. The method as recited in claim 1, wherein one of a plurality of implants is forwarded into junction regions within said semiconductor substrate laterally defined between the polysilicon spacer removed of said oxide.

5. The method as recited in claim 1, further comprising implanting dopants of differing concentrations into a pair of junction areas between which a channel area is interposed, said dopants are implanted in succession after a respective said etch stop, said polysilicon spacer and said oxide is formed.

6. The method as recited in claim 1, further comprising implanting dopants of differing concentrations into a pair of junction areas between which a channel area is interposed, said dopants are implanted in succession after a respective said etch stop, said polysilicon spacer and said oxide is removed.

7. The method as recited in claim 1, wherein said etch stop, said polysilicon spacer and said oxide have dissimilar etch characteristics corresponding to selectively removal thereof.

8. A method for forming an integrated circuit, comprising:
    providing a semiconductor topography upon which a gate conductor having opposed sidewall surfaces is formed;
    forming a sequence of dielectric layers upon the sidewall surfaces, wherein one of said sequence of dielectric layers comprises a grown oxide which, during thermal growth, partially consumes an immediately underlying, silicon-based dielectric layer,
    implanting into a junction area within said semiconductor topography after said sequence of dielectric layers is at least partially formed; and implanting into the junction area after said oxide and the partially consumed underlying silicon-based dielectric layer are removed.

9. The method as recited in claim 8, wherein said first implanting step occurs at a concentration and implant energy dissimilar from said second implanting step.

10. The method as recited in claim 8, wherein said sequence of dielectric layers comprises a polysilicon spacer interposed between an etch stop layer and an oxide layer, the etch stop layer being immediately adjacent said sidewall surfaces and comprises a layer of silicon dioxide and a layer of silicon nitride.

11. The method as recited in claim 8, wherein said layer of silicon dioxide is thermally grown upon and within said sidewall surfaces and said layer of nitride is deposited upon said layer of silicon dioxide.

* * * * *